United States Patent
Hara et al.

[11] Patent Number: 6,163,177
[45] Date of Patent: Dec. 19, 2000

[54] SEMICONDUCTOR INTEGRATED CIRCUIT DEVICE HAVING OUTPUT BUFFER

[75] Inventors: Motoko Hara; Hiroshi Akamatsu; Yutaka Ikeda, all of Hyogo, Japan

[73] Assignee: Mitsubishi Denki Kabushiki Kaisha, Tokyo, Japan

[21] Appl. No.: 09/219,781

[22] Filed: Dec. 23, 1998

[30] Foreign Application Priority Data

Jul. 23, 1998 [JP] Japan ................... 10-207680

[51] Int. Cl.[7] ................ H03B 1/00; H03K 3/00
[52] U.S. Cl. ............... 327/108; 327/112; 327/111; 327/109
[58] Field of Search .................. 327/108–112, 379, 327/382, 436, 437; 326/81, 83, 21, 23, 27

[56] References Cited

U.S. PATENT DOCUMENTS

| | | | |
|---|---|---|---|
| 5,334,889 | 8/1994 | Hisaka ........................... | 327/108 |
| 5,338,988 | 8/1994 | Yamamura et al. ............. | 327/108 |
| 5,396,463 | 3/1995 | Kim et al. . | |
| 5,912,569 | 6/1999 | Alleven ........................... | 327/112 |
| 5,952,875 | 9/1999 | Yosefin et al. .................. | 327/108 |
| 6,037,811 | 3/2000 | Ozguc ............................. | 327/108 |

FOREIGN PATENT DOCUMENTS

| | | |
|---|---|---|
| 6-84373 | 3/1994 | Japan . |
| 9-128978 | 5/1997 | Japan . |

*Primary Examiner*—Kenneth B. Wells
*Assistant Examiner*—Long Nguyen
*Attorney, Agent, or Firm*—McDermott, Will & Emery

[57] ABSTRACT

An output buffer includes an NAND circuit, a first N channel MOS transistor connected between a power supply node and an output node, a second N channel MOS transistor connected between the output node and a ground node, the first to third drive circuits, and a delay circuit. The power supply voltage is first supplied to the gate of the second N channel MOS transistor by the second drive circuit. After a delay time delayed by the delay circuit has passed, boosted voltage is supplied to the gate of the second N channel MOS transistor by the third drive circuit. Accordingly, the output buffer is not influenced by the ringing and the pull-down characteristic improves.

5 Claims, 6 Drawing Sheets

FIG. 3a OEM
FIG. 3b RD
FIG. 3c N1
FIG. 3d N2
FIG. 3e N3
FIG. 3f N4
FIG. 3g OUT

FIG. 5a Vcc
FIG. 5b POR
FIG. 5c /MSET
FIG. 5d CAD
FIG. 5e N5
FIG. 5f MAD

FIG. 6a OEM
FIG. 6b RD
FIG. 6c OUT

FIG. 7a OEM

FIG. 7e OUT

SEMICONDUCTOR INTEGRATED CIRCUIT DEVICE HAVING OUTPUT BUFFER

BACKGROUND OF THE INVENTION

1. Field of the Invention

The present invention relates to semiconductor integrated circuit devices, particularly to a semiconductor integrated circuit device having an output buffer including an MOS transistor that receives voltage at its gate higher than supply voltage to discharge an output node.

2. Description of the Background Art

A semiconductor memory device such as a DRAM (Dynamic Random Access Memory) includes an output buffer for outputting an internal data signal to any external unit. A buffer of N—N type is usually used at the final stage of the output buffer. A power supply voltage Vcc is supplied to the gate of an N channel MOS transistor connected to the ground node for obtaining an output of an L (logical low) level from the N—N type buffer. In order to improve a pull-down characteristic of the output of such an output buffer, the size (gate width) of the N channel MOS transistor of the N—N type buffer should be increased.

With the recent miniaturization of semiconductor memory devices, an output buffer is implemented that can improve the pull-down characteristic of an output without increasing the size of the transistor as shown in FIG. 9.

Referring to FIG. 9 illustrating the output buffer, when an output enable signal OEM and a read data signal RD attain an H (logical high) level, the level of an output of an NAND circuit ND goes L and accordingly the level of an output of an inverter IV goes H. Further, an N channel MOS transistor NT is turned on and the level of a node N goes L. Consequently, a P channel MOS transistor PT connected to a boosted node Vpp having a voltage Vpp higher than power supply voltage Vcc is turned on and voltage Vpp is supplied to the gate of an N channel MOS transistor NTb. Accordingly, N channel MOS transistor NTb is turned on more speedily compared with the case in which supply voltage Vcc is supplied to the gate. The pull-down characteristic of the output is thus improved.

Although the fall time of an output DQ is shortened by supplying voltage Vpp higher than supply voltage Vcc to the gate of N channel MOS transistor NTb, the shortened fall time is likely to cause ringing. The influence of the ringing causes such problems as that a desired output voltage cannot be obtained and the access time is delayed.

SUMMARY OF THE INVENTION

The present invention is made to solve such problems as described above. One object of the present invention is to provide a semiconductor integrated circuit including an output buffer with the pull-down characteristic improved without affected by the ringing.

A semiconductor integrated circuit device according to the invention includes an internal circuit and an output buffer. The internal circuit responds to an external input signal to generate an internal signal. The output buffer responds to the internal signal to generate an external output signal. The output buffer includes a first N channel MOS transistor, a second N channel MOS transistor, and a control circuit. The first N channel MOS transistor is connected between a power supply node and an output node, turned on when the internal signal is in a first state, and turned off when the internal signal is in a second state. The second N channel MOS transistor is connected between the output node and a ground node and turned on/off complementarily to the first N channel MOS transistor. The control circuit supplies a ground voltage to the gate of the second N channel MOS transistor when the internal signal is in the first state, supplies a power supply voltage to the gate of the second N channel MOS transistor when the internal signal is in the second state, and supplies voltage higher than the power supply voltage to the gate of the second N channel MOS transistor.

In the semiconductor integrated circuit device, the first N channel MOS transistor is turned on and the second N channel MOS transistor is turned off when the internal signal is in the first state. Consequently, the power supply voltage is supplied to the output node by the first N channel MOS transistor. When the internal signal is in the second state, the second N channel MOS transistor receives at its gate the power supply voltage to be turned on so that the ground voltage is supplied to the output node. Accordingly, the ringing can be prevented since the output node is not suddenly supplied with the ground voltage. Voltage higher than the supply voltage is supplied to the gate of the second N channel MOS transistor after a prescribed time has passed after the gate is supplied with the power supply voltage. The second N channel MOS transistor is accordingly turned on more strongly to supply the ground voltage to the output node more quickly. As a result, the pull-down characteristic is enhanced.

Preferably, the control circuit includes a first drive circuit, a delay circuit, and a second drive circuit. The first drive circuit supplies the ground voltage to the gate of the second N channel MOS transistor when the internal signal is in the fist state, and supplies the power supply voltage to the gate of the second N channel MOS transistor when the internal signal is in the second state. The delay circuit delays the internal signal. The second drive circuit supplies the ground voltage to the gate of the second N channel MOS transistor when the internal signal delayed by the delay circuit is in the first state, and supplies voltage higher than the power supply voltage to the gate of the second N channel MOS transistor when the internal signal delayed by the delay circuit is in the second state.

In the semiconductor integrated circuit device, the first N channel MOS transistor is turned on and the second N channel MOS transistor is turned off when the internal signal is in the first state. As a result, the output node is supplied with the power supply voltage by the first N channel MOS transistor. When the internal signal is in the second state, the power supply voltage is supplied to the gate of the second N channel MOS transistor by the first drive circuit to allow the output node to be supplied with the ground voltage. Accordingly, the ringing can be prevented since the output node is not suddenly supplied with the ground voltage. In addition, voltage higher than the supply voltage is supplied to the gate of the second N channel MOS transistor by the second drive circuit after the delay time by the delay circuit has passed. Consequently, the second N channel MOS transistor is more strongly turned on and the ground voltage is more quickly supplied to the output node. The pull-down characteristic is thus improved.

Preferably, the semiconductor integrated circuit device farther includes a latch circuit and a mode set signal generating circuit. The control circuit includes a first drive circuit, a delay circuit and a second drive circuit. The latch circuit latches an external input signal. The mode set signal generating circuit generates a mode set signal that enables the latch circuit to latch. The first drive circuit stops when an output from the latch circuit is in the first state, and operates when the output from the latch circuit is in the second state to supply the ground voltage to the gate of the second N channel MOS transistor when the internal signal is in the first state and supply the power supply voltage to the gate of the second N channel MOS transistor when the internal signal is in the second state. The delay circuit stops when the output from the latch circuit is in the first state, and operates when the output from the latch circuit is in the second state to delay the internal signal. The second drive circuit receives the internal signal when the output from the latch circuit is in the first state. When the internal signal is i the first state, the second drive circuit supplies the ground voltage to the gate of the second N channel MOS transistor, and supplies voltage higher than the power supply voltage to the gate of the second N channel MOS transistor when the internal signal is in the second state. The second drive circuit receives an internal signal delayed by the delay circuit when the output from the latch circuit is in the second state to supply the ground voltage to the gate of the second N channel MOS transistor when the internal signal delayed by the delay circuit is in the first state and to supply voltage higher than the supply voltage to the gate of the second N channel MOS transistor when the internal signal delayed by the delay circuit is in the second state.

In the semiconductor integrated circuit device, the delay circuit and the first drive circuit stop when the output from the latch circuit is in the first state. Consequently, when the internal signal is in the second state, the second N channel MOS transistor receives voltage higher than the power supply voltage at its gate from the second drive circuit to be turned on and cause the output node to be supplied with the ground voltage. When the output from the latch circuit is in the second state, the delay circuit and the first drive circuit operate. Consequently, when the internal signal is in the second state, the first drive circuit supplies the power supply voltage to the gate of the second N channel MOS transistor to cause the output node to be supplied with the ground voltage. Further, voltage higher than the supply voltage is provided to the gate of the second N channel MOS transistor after the delay time by the delay circuit has passed. The voltage supplied to the gate of the second N channel MOS transistor can be changed by the external input signal. As a result, the output buffer is never affected by the ringing and the pull-down characteristic is improved.

Preferably, the semiconductor integrated circuit device further includes a pad connected to a power supply terminal or a ground terminal. The control circuit includes a first drive circuit, a delay circuit and a second drive circuit. The first drive circuit stops when the voltage on the pad is one of the supply voltage and the ground voltage, and operates when the voltage on the pad is the other of the supply voltage and the ground voltage. When the internal signal is in the first state, the first drive circuit supplies the ground voltage to the gate of the second N channel MOS transistor, and supplies the power supply voltage to the gate of the second N channel MOS transistor when the internal signal is in the second state. The delay circuit stops when the voltage on the pad is one of the supply voltage and the ground voltage, and operates when the voltage on the pad is the other of the supply voltage and the ground voltage to delay the internal signal. The second drive circuit receives the internal signal when the voltage on the pad is one of the supply voltage and the ground voltage, supplies the ground voltage to the gate of the second N channel MOS transistor when the internal signal is in the first state, and supplies voltage higher than the power supply voltage to the gate of the second N channel MOS transistor when the internal signal is in the second state. The second drive circuit receives the internal signal delayed by the delay circuit when the voltage on the pad is the other of the supply voltage and the ground voltage, supplies the ground voltage to the gate of the second N channel MOS transistor when the internal signal delayed by the delay circuit is in the first state, and supplies voltage higher than the power supply voltage to the gate of the second N channel MOS transistor when the internal signal delayed by the delay circuit is in the second state.

In the semiconductor integrated circuit device, when the voltage on the pad is one of the supply voltage and the ground voltage, the delay circuit and the first drive circuit stop. Accordingly, when the internal signal is in the second state, the second N channel MOS transistor is supplied with voltage higher than the power supply voltage at its gate from the second drive circuit to be turned on and cause the output node to be supplied with the ground voltage. When the voltage on the pad is the other of the supply voltage and the ground voltage, the delay circuit and the first drive circuit operate. Consequently, when the internal signal is in the second state, the supply voltage is supplied to the gate of the second N channel MOS transistor by the first drive circuit and the output node is supplied with the ground voltage. Further, voltage higher than the supply voltage is provided to the gate of the second N channel MOS transistor after the delay time by the delay circuit has passed. The voltage supplied to the gate of the second N channel MOS transistor can be changed by wire-bonding of the pad. As a result, the output buffer is never affected by the ringing and the pull-down characteristic improves.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 5a–5f are timing charts presented for describing an operation of the output buffer illustrated in FIG. 4.

FIGS. 6a–6c are timing charts presented for describing an operation of the output buffer illustrated in FIG. 4.

FIGS. 7a–7e are timing charts presented for describing an operation of the output buffer illustrated in FIG. 4.

DESCRIPTION OF THE PREFERRED EMBODIMENTS

Figure 1:
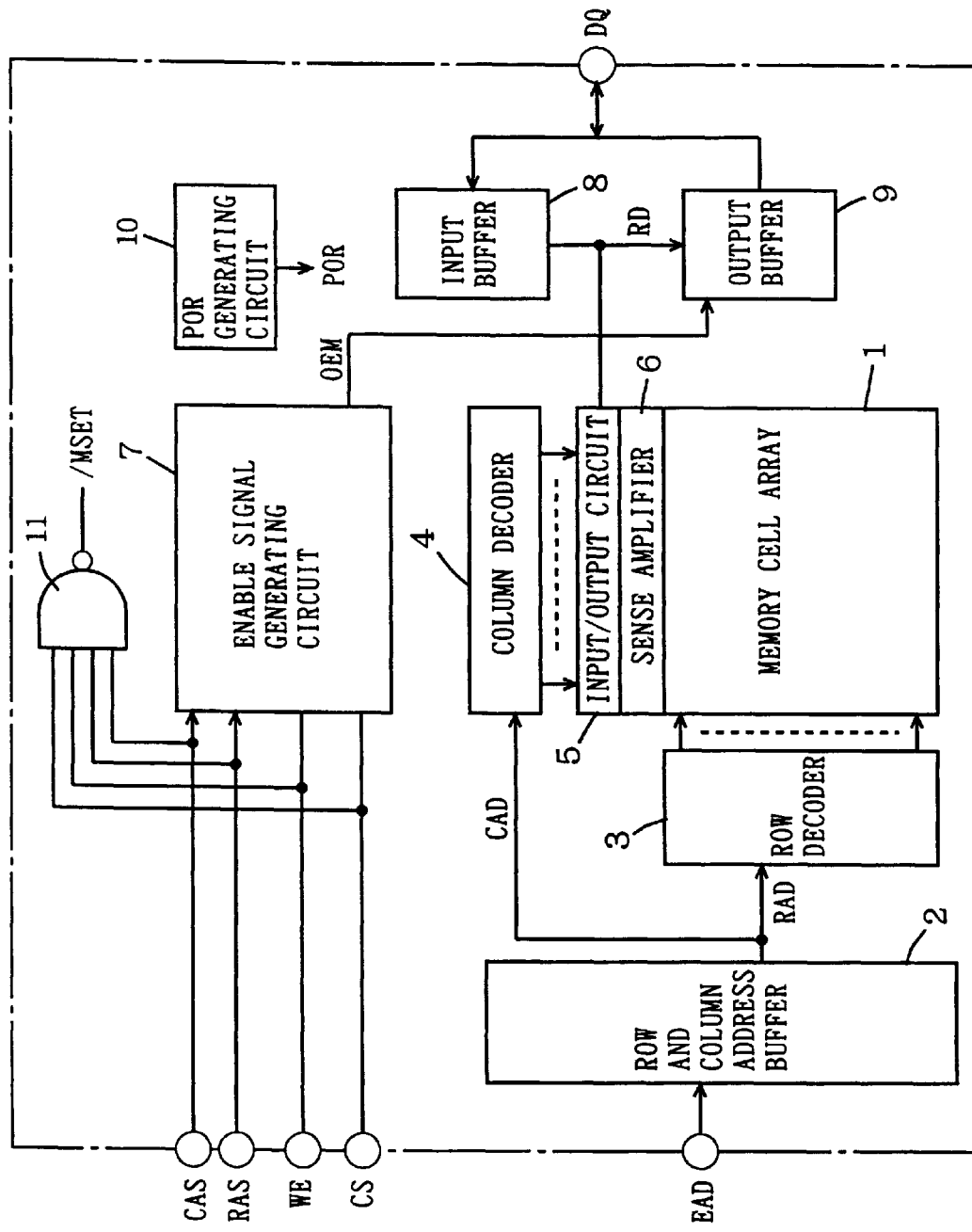
FIG. 1 is a block diagram illustrating an entire structure of a DRAM according to the first embodiment of the invention.

The embodiments of the present invention are described in detail in conjunction with the drawings. Like components or corresponding components have the same reference characters and description thereof is not repeated.

(First Embodiment)

FIG. 1 is a block diagram illustrating an entire structure of a DRAM according to the first embodiment of the invention. Referring to FIG. 1, the DRAM includes a memory cell array 1, a row and column address buffer 2, a row decoder 3, a column decoder 4, an input/output circuit 5, a sense amplifier 6, an enable signal generating circuit 7, an input buffer 8, an output buffer 9, a POR generating circuit 10, and an NAND circuit 11. Memory cell array 1 includes a plurality of memory cells (not shown) arranged in rows and columns, a plurality of word lines (not shown) arranged in rows, and a plurality of bit line pairs (not shown) arranged in columns. Row and column address buffer 2 responds to a row address strobe signal /RAS to supply an external address signal EAD as a row address signal RAD to row decoder 3, and responds to a column address strobe signal /CAS to supply external address signal EAD as a column address signal CAD to column decoder 4. Row decoder 3 responds to row address signal RAD from row and column address buffer 2 to select a row (word line) of memory cell array 1. Column decoder 4 responds to column address signal CAD from row and column address buffer 2 to select a column (bit line pair) of memory cell array 1. Input/output circuit 5 writes a data signal supplied from input buffer 8 into a memory cell, and outputs a data signal from sense amplifier 6 to the output buffer. Sense amplifier 6 amplifies a data signal read from a memory cell (not shown) in memory cell array 1. Enable signal generating circuit 7 responds to a row address strobe signal RAS, a column address strobe signal CAS, a write enable signal WE and a chip select signal CS to generate an output enable signal OEM. Input buffer 8 outputs an externally supplied data signal DQ to input/output circuit 5. Output buffer 9 responds to output enable signal OEM to output an internal data signal RD from the input/output circuit as external data signal DQ to any external unit. POR generating circuit 10 generates a power on reset signal POR that is at the H level for a prescribed time after the memory is powered. NAND circuit 11 responds to row address strobe signal RAS, column address strobe signal CAS, write enable signal WE and chip select signal CS to generate a mode set signal /MSET.

Figure 2:
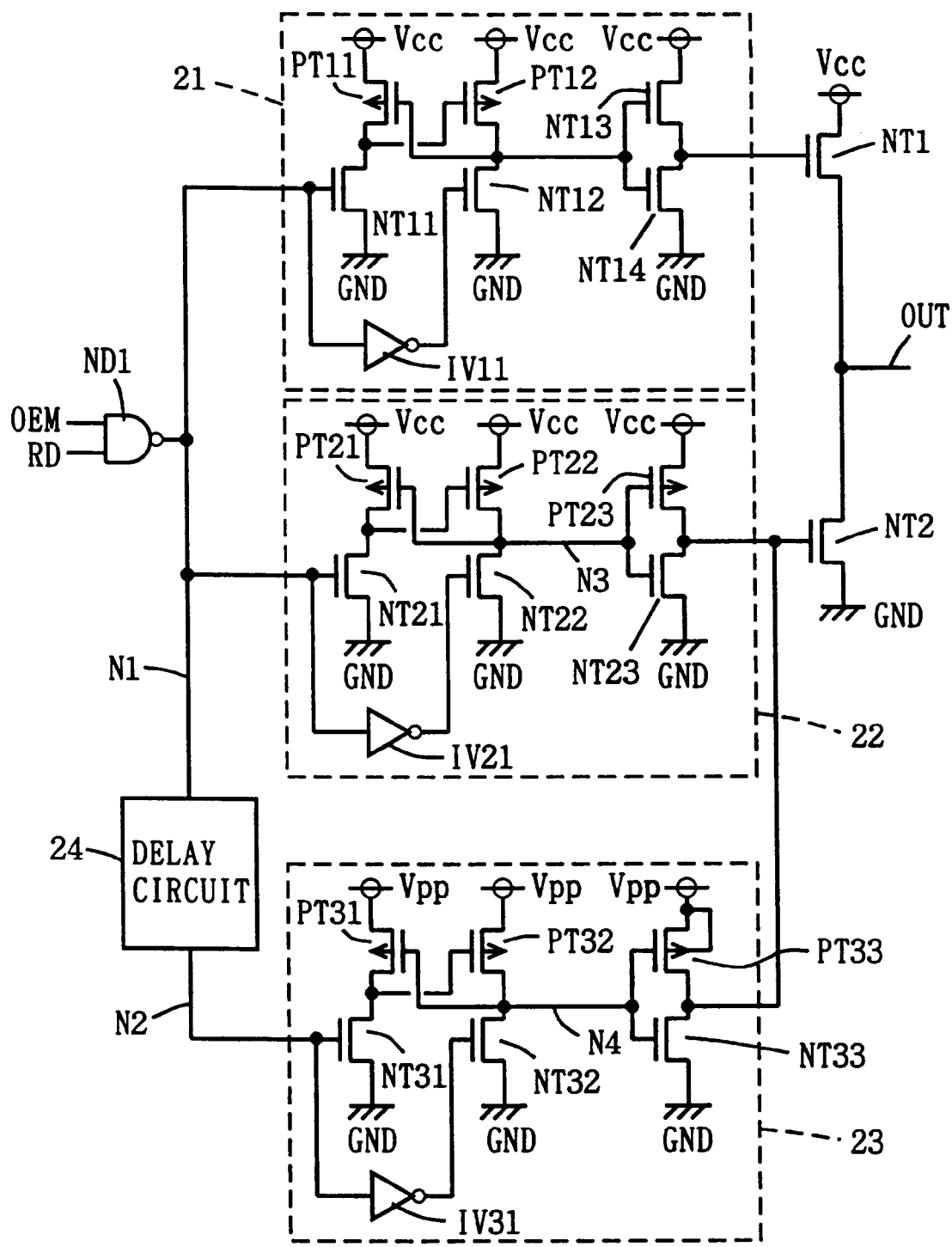
FIG. 2 is a block diagram showing an entire structure of an output buffer shown in FIG. 1.
Figure 3:
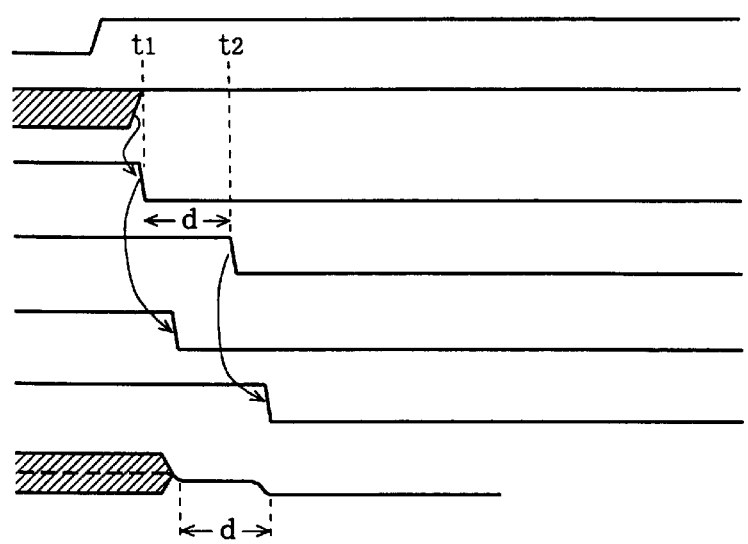
FIGS. 3a–3g are timing charts presented for describing an operation of the output buffer shown in FIG. 2.

FIG. 2 is a block diagram illustrating an entire structure of output buffer 9 shown in FIG. 1. Referring to FIG. 2, the output buffer includes an NAND circuit ND1, N channel MOS transistors NT1 and NT2, drive circuits 21–23, and a delay circuit 24. NAND circuit ND1 outputs NAND of output enable signal OEM and data signal RD. N channel MOS transistor NT1 is connected between a power supply node Vcc and an output node OUT, and receives at its gate an output from drive circuit 21. N channel MOS transistor NT2 is connected between output node OUT and a ground node GND and receives at its gate outputs from drive circuits 22 and 23.

Drive circuit 21 includes P channel MOS transistors PT11 and PT12, N channel MOS transistors NT11–NT14, and an inverter IV11. P channel MOS transistor PT11 is connected between supply node Vcc and N channel MOS transistor NT11, and receives at its gate the voltage on an interconnection node of P channel MOS transistor PT12 and N channel MOS transistor NT12. N channel MOS transistor NT11 is connected between P channel MOS transistor PT11 and ground node GND, and receives an output from NAND circuit ND1 at its gate. P channel MOS transistor PT12 is connected between supply node Vcc and N channel MOS transistor NT 12, and receives at its gate the voltage on an interconnection node of P channel MOS transistor PT11 and N channel MOS transistor NT11. N channel MOS transistor NT12 is connected between P channel MOS transistor PT12 and ground node GND, and receives at its gate an output from inverter IV11. Inverter IV11 inverts an output from NAND circuit ND1. N channel MOS transistors NT13 and NT14 are connected in series between supply node Vcc and ground node GND, and receives at their gates the voltage on the interconnection node of P channel MOS transistor PT12 and N channel MOS transistor NT12. Voltage on an interconnection node of N channel MOS transistors NT13 and NT14 is supplied to the gate of N channel MOS transistor NT1.

Drive circuit 22 includes P channel MOS transistors PT21–PT23, N channel MOS transistors NT21–NT23, and an inverter IV21. P channel MOS transistor PT21 is connected between supply node Vcc and N channel MOS transistor NT21, and receives at its gate the voltage on an interconnection node of P channel MOS transistor PT22 and N channel MOS transistor NT22. N channel MOS transistor NT21 is connected between P channel MOS transistor PT21 and ground node GND, and receives at its gate an output from NAND circuit ND1. P channel MOS transistor PT22 is connected between supply node Vcc and N channel MOS transistor NT22, receives at its gate the voltage on an interconnection node of P channel MOS transistor PT21 and N channel MOS transistor NT21. N channel MOS transistor NT22 is connected between P channel MOS transistor PT22 and ground node GND, and receives an output from inverter IV21 at its gate. Inverter IV21 inverts an output from NAND circuit ND1. P channel MOS transistor PT23 and N channel MOS transistor NT23 are connected in series between supply node Vcc and ground node GND, and receives at their gates the voltage on the interconnection node of P channel MOS transistor PT22 and N channel MOS transistor NT22. Further, voltage on an interconnection node of P channel MOS transistor PT23 and N channel MOS transistor NT23 is supplied to the gate of N channel MOS transistor NT2.

Drive circuit 23 includes P channel MOS transistors PT31–PT33, N channel MOS transistors NT31–NT33, and an inverter IV31. P channel MOS transistor PT31 is connected between a boosted node Vpp boosted to voltage Vpp higher than supply voltage Vcc and N channel MOS transistor NT31, and receives at its gate the voltage on an interconnection node of P channel MOS transistor PT32 and N channel MOS transistor NT32. N channel MOS transistor NT31 is connected between P channel MOS transistor PT31 and ground node GND, and receives at its gate an output from delay circuit 24. P channel MOS transistor PT32 is connected between boosted node Vpp and N channel MOS transistor NT32, and receives at its gate the voltage on an interconnection node of P channel MOS transistor PT31 and N channel MOS transistor NT31. N channel MOS transistor NT32 is connected between P channel MOS transistor PT32 and ground node GND, and receives at its gate an output from inverter IV31. Inverter IV31 inverts an output from delay circuit 24. P channel MOS transistor PT33 and N channel MOS transistor NT33 are connected in series between boosted node Vpp and ground node GND, and receive at the gates the voltage on the interconnection node of P channel MOS transistor PT32 and N channel MOS transistor NT32. Further, the voltage on an interconnection node of P channel MOS transistor PT33 and N channel MOS transistor NT33 is supplied to the gate of N channel MOS transistor NT2. Delay circuit 24 delays an output from NAND circuit ND1 to output the delayed one to a node N2.

Referring to FIGS. 3a–3g, an operation of the DRAM configured as above is described.

At time t1, output enable signal OEM from enable signal generating circuit 7 and data signal RD from input/output circuit 5 are both at the H level to cause an output of NAND circuit ND1 or a node N1 to fall to the L level. Accordingly, a signal at the L level is output from drive circuit 21 and N channel MOS transistor NT1 is turned off. In drive circuit 22, N channel MOS transistor NT21 is turned off and N channel MOS transistor NT22 is turned on to cause the ground voltage to be supplied to the gate of P channel MOS transistor PT21. Consequently, P channel MOS transistor PT21 is turned on and P channel MOS transistor PT22 is turned off. A node N3 is thus supplied with ground voltage GND. Receiving ground voltage GND on node N3, P channel MOS transistor PT23 is turned on and N channel MOS transistor NT23 is turned off. The interconnection node of P channel MOS transistor PT23 and N channel MOS transistor NT23 has power supply voltage Vcc, and supply voltage Vcc is provided to the gate of N channel MOS transistor NT2. As a result, N channel MOS transistor NT2 is turned on and voltage on output node OUT falls.

Voltage on node N1 is delayed by time d by delay circuit 24 to be output to node N2. At time t2 at which time d has passed from time t1, node N2 is at the L level. Accordingly, in drive circuit 23, N channel MOS transistor NT31 is turned off and N channel MOS transistor NT32 is turned on. P channel MOS transistor PT 31 is turned on and P channel MOS transistor PT32 is turned off. Node N4 thus has ground voltage GND. Receiving ground voltage GND on node N4, P channel MOS transistor PT33 is turned on and N channel MOS transistor NT33 is turned off. Accordingly, the interconnection node of P channel MOS transistor PT33 and N channel MOS transistor NT33 has boosted voltage Vpp, and boosted voltage Vpp is supplied to the gate of N channel MOS transistor NT2. As a result, N channel MOS transistor NT2 is turned on more strongly, and output node OUT is supplied with ground voltage GND.

N channel MOS transistor NT2 receives supply voltage Vcc during the time d from time t1 and is then turned on so that output node OUT is provided with ground voltage GND. The ringing of an output can thus be prevented.

At time t2, N channel MOS transistor NT2 receives at its gate the boosted voltage Vpp to be turned on far more strongly. As a result, voltage on output node OUT falls more quickly. The pull-down characteristic can be further improved.

The ratio between the rise time and the fall time of an output can be adjusted to be a desired value by adjusting delay time d caused by delay circuit 24. Therefore, the ringing can be prevented effectively to obtain a desired pull-down characteristic.

According to the first embodiment, drive circuits 22 and 23 and delay circuit 24 are provided to improve the pull-down characteristic of output buffer 9 without affected by the ringing.

Delay time d caused by delay circuit 24 can be adjusted to achieve an effective prevention of the ringing and a desired pull-down characteristic.

(Second Embodiment)

Figure 4:
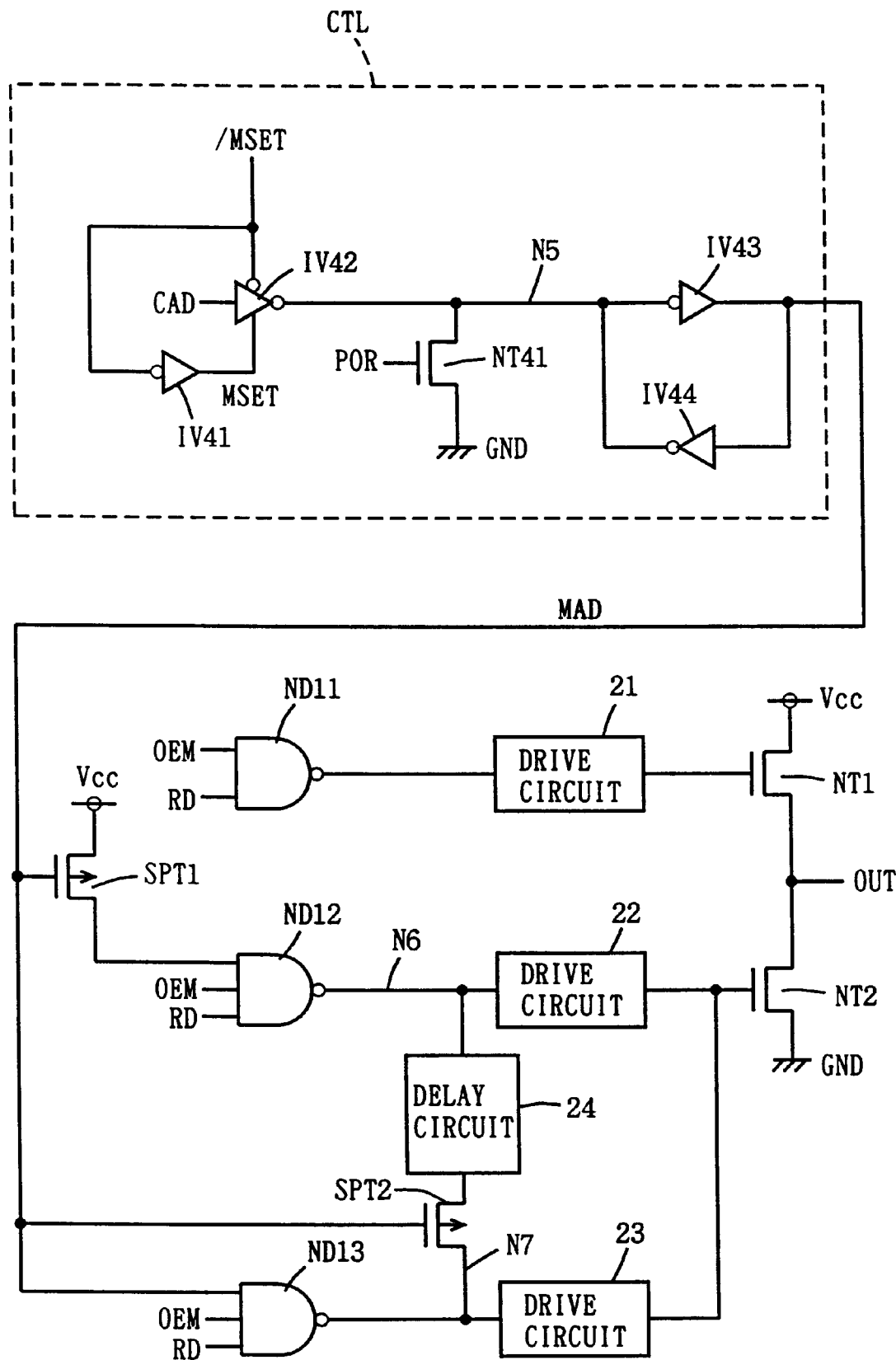
FIG. 4 is a block diagram showing an entire structure of an output buffer according to the second embodiment of the invention.

FIG. 4 is a block diagram illustrating an entire structure of an output buffer of a DRAM according to the second embodiment of the invention. Referring to FIG. 4, the output buffer includes a control signal generating circuit CTL, NAND circuits ND11–ND13, P channel MOS transistors SPT1 and SPT2, drive circuits 21–23, a delay circuit 24, and N channel MOS transistors NT1 and NT2.

Control signal generating circuit CTL includes inverters IV41–IV44, and an N channel MOS transistor NT41.

Inverter IV41 inverts a mode set signal /MSET generated by NAND circuit 11 shown in FIG. 1. Inverter IV42 responds to mode set signal /MSET and an output MSET from inverter IV41 to be activated, inverts a column address signal CAD and outputs it to a node N5. Inverters IV43 and IV44 constitute a latch circuit for inverting and holding a value of node N5. An output from the latch circuit is a control signal MAD. N channel MOS transistor NT41 is connected between node N5 and ground node GND and receives at its gate a power on reset signal POR.

P channel MOS transistor SPT1 has the source connected to a power supply node Vcc and the drain connected to an input of NAND circuit ND12, and responds to a control signal MAD to be turned on/off. P channel MOS transistor SPT2 is connected between delay circuit 24 and a node N7, and responds to control signal MAD to be turned on/off. NAND circuit ND11 outputs NAND of output enable signal OEM and data signal RD to drive circuit 21. NAND circuit ND12 receives at its input output enable signal OEM, data signal RD, and the drain voltage of P channel MOS transistor SPT1, and outputs NAND thereof to a node N6. NAND circuit ND13 receives at its input output enable signal OEM, data signal RD and control signal MAD, and outputs NAND thereof to node N7. Drive circuit 21 has the same configuration as that shown in FIG. 2, and responds to an output from NAND circuit ND11 to output ground voltage GND or supply voltage Vcc to the gate of N channel MOS transistor NT1. Drive circuit 22 has the same configuration as that shown in FIG. 2, and responds to the voltage on node N6 to output ground voltage GND or supply voltage Vcc to the gate of N channel MOS transistor NT2. Drive circuit 23 has the same configuration as that shown in FIG. 2, and responds to the voltage on node N7 to output voltage Vpp higher than supply voltage Vcc or output ground voltage GND to the gate of N channel MOS transistor NT2. Delay circuit 24 delays a value of node N6 and outputs it.

An operation of the DRAM configured as described above is described below.

Referring to FIGS. 5a–5f, rising of supply voltage Vcc allows power on reset signal POR to be at the H level for a prescribed time. Accordingly, the level of node N5 goes L, and this value is inverted and held by the latch circuit constituted of inverters IV43 and IV44. Consequently, control signal MAD at the H level is output from control signal generating circuit CTL.

From time t1, mode set signal /MSET is at the L level for a prescribed time and accordingly inverter IV42 is activated to invert column address signal CAD at the L level and the inverted one is output to node N5. Node N5 attains the H level and this value is inverted and held by the latch circuit constituted of inverters IV43 and IV44. Consequently, control signal MAD at the L level is output from control signal generating circuit CTL.

Similarly, at time t2, column address signal CAD at the L level is inverted to be output to node N5, and control signal MAD at the H level is output from control signal generating circuit CTL.

As described above, the value of control signal MAD changes according to the value of column address signal CAD when mode set signal /MSET falls to the L level.

Description of two cases in which control signal MAD is at the H level and at the L level respectively is given below.

(a) Control signal MAD at H level

In this case, P channel MOS transistors SPT1 and SPT2 are turned off. Therefore, drive circuit 22, delay circuit 24 and NAND circuit ND12 do not operate.

Referring to FIGS. 6a–6c, when output enable signal OEM and data signal RD both attain the H level, outputs from NAND circuits ND11 and ND13 fall to the L level.

Accordingly, a signal at the L level is output from drive circuit 21 and N channel MOS transistor NT1 is turned off. In drive circuit 23, boosted voltage Vpp is supplied to the gate of N channel MOS transistor NT2 in the same manner as described in conjunction with the first embodiment. Consequently, N channel MOS transistor NT2 is more strongly turned on compared with the case in which supply voltage Vcc is supplied to the gate, and output node OUT is supplied with ground voltage GND. Accordingly, voltage on output node OUT more speedily falls to improve the pull-down characteristic.

(b) Control signal MAD at L level

In this case, P channel MOS transistors SPT1 and SPT2 are turned on. Accordingly, drive circuits 22 and 23, delay circuit 24 and NAND circuit ND12 operate.

Referring to FIGS. 7a–7e, when output enable signal OEM and data signal RD both attain the H level, outputs of NAND circuits ND11 and ND12 fall to the L level. Accordingly, a signal at the L level is output from drive circuit 21 to cause N channel MOS transistor NT1 to be turned off. An output of NAND circuit ND12 falling to the L level causes node N6 to fall to the L level. Supply voltage Vcc is supplied by drive circuit 22 to the gate of N channel MOS transistor NT2 in the same manner as that of the first embodiment. Consequently, N channel MOS transistor NT2 is turned on to cause the voltage on output node OUT to fall.

The voltage on node N6 is delayed by delay circuit 24 by time d to be output. Boosted voltage Vpp is supplied to the gate of N channel MOS transistor NT2 by drive circuit 23 after time d has passed from the time at which supply voltage Vcc is supplied to the gate of N channel MOS transistor NT2 in the same manner as that of the first embodiment. As a result, N channel MOS transistor NT2 is turned on more strongly and ground voltage GND is supplied to output node OUT. An effect similar to that of the first embodiment is thus obtained.

According to the second embodiment, control signal generating circuit CTL, and P channel MOS transistors SPT1 and SPT2 are provided to supply to the gate of N channel MOS transistor NT2 with two types of voltages, that is, (1) boosted voltage Vpp, and (2) supply voltage Vcc and thereafter boosted voltage Vpp. The voltage supplied to the gate of N channel MOS transistor NT2 can be changed as required, by mode set signal /MSET and column address signal CAD. Accordingly, the ringing can be prevented effectively and a desired pull-down characteristic can be obtained.

Although column address signal CAD is used for changing the value of control signal MAD, any other external input signal may be used.

(Third Embodiment)

Figure 8:
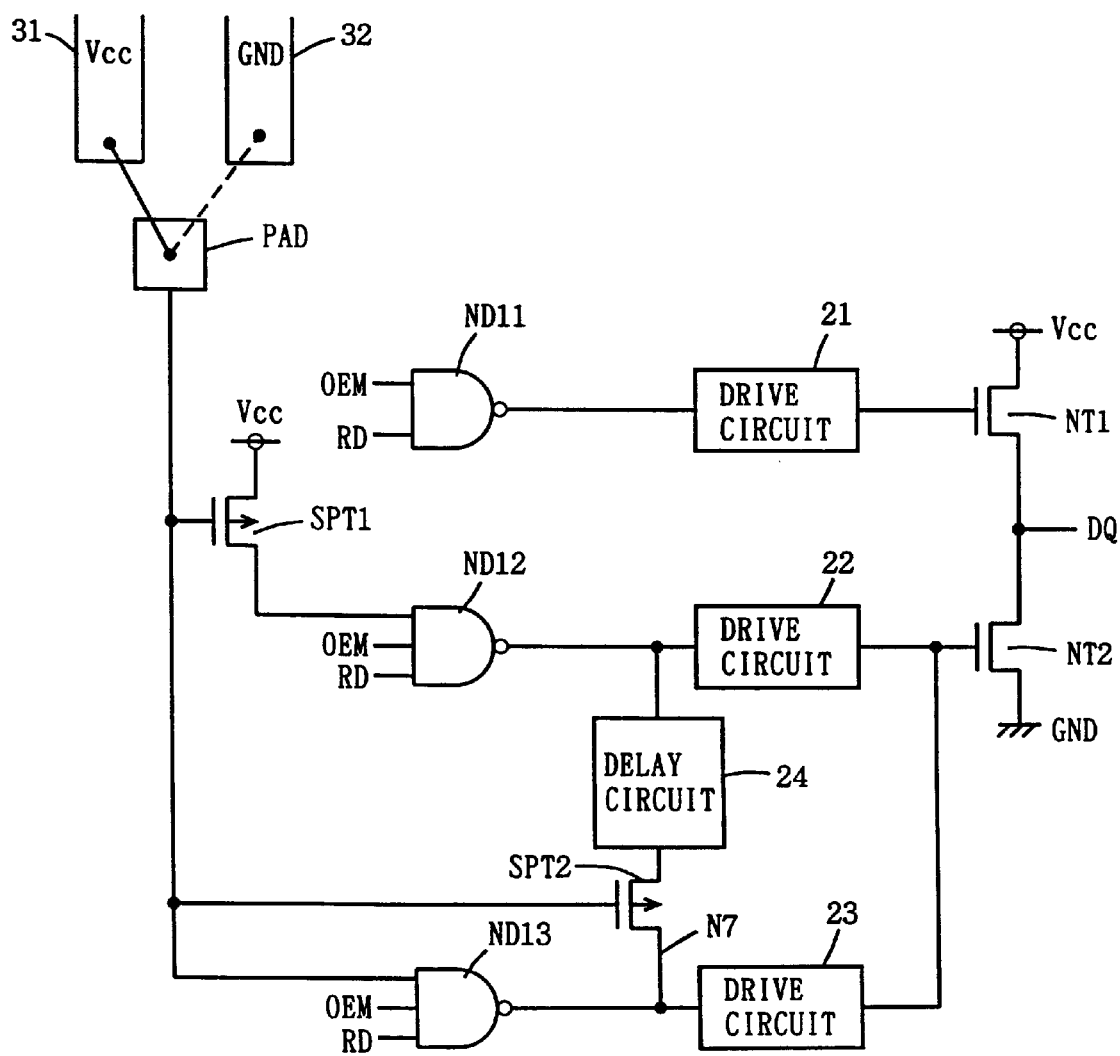
FIG. 8 is a block diagram showing an entire structure of an output buffer according to the third embodiment of the invention.
Figure 9:
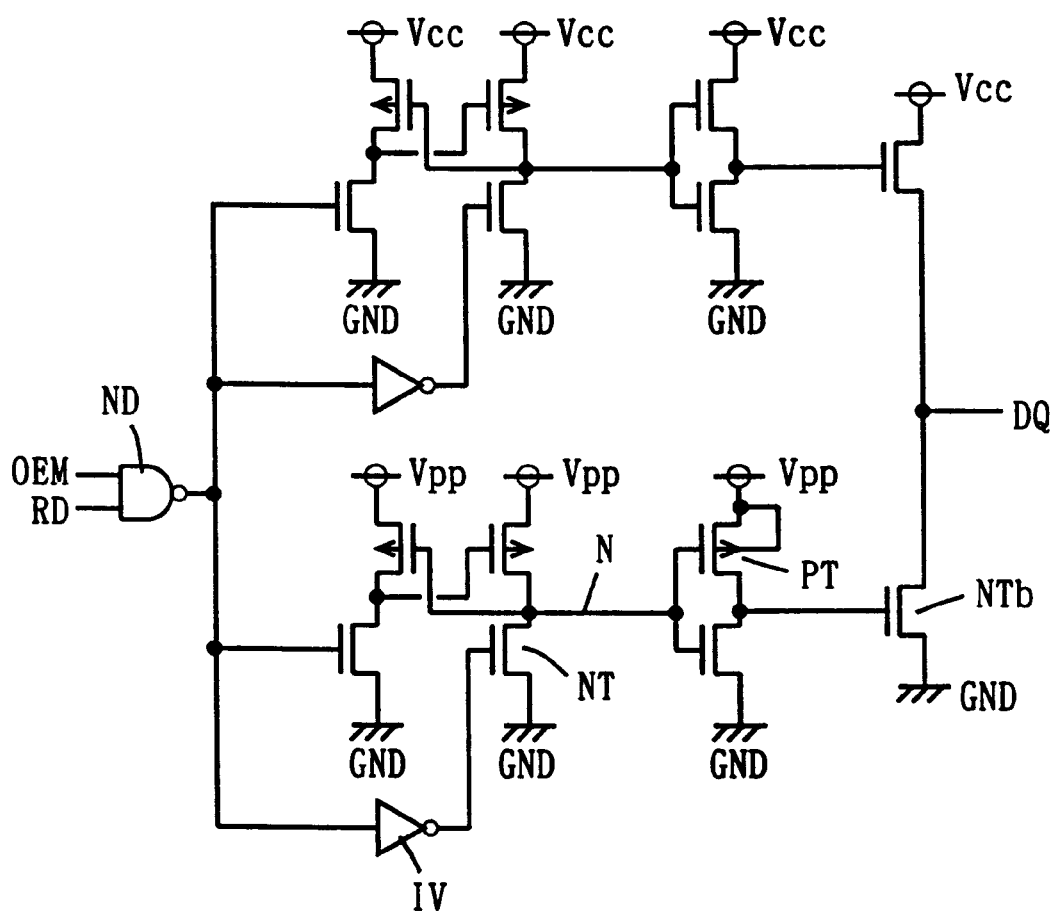
FIG. 9 is a block diagram illustrating an entire structure of a conventional output buffer.

FIG. 8 is a block diagram illustrating an entire structure of an output buffer of a DRAM according to the third embodiment of the invention. Referring to FIG. 8, the output buffer includes a pad PAD in place of control signal generating circuit CTL shown in FIG. 4. Pad PAD is connected to either a power supply terminal 31 or a ground terminal 32 by wire-bonding.

An operation of the DRAM configured as above is described below.

When pad PAD is wire-bonded to supply terminal 31, pad PAD has supply voltage Vcc. Consequently, the DRAM operates similarly to that of the second embodiment in the case of "(a) control signal MAD at H level."

When pad PAD is wire-bonded to ground terminal 32, pad PAD has ground voltage GND. Consequently, the DRAM operates similarly to that of the second embodiment in the case of "(b) control signal MAD at L level."

According to the third embodiment, pad PAD and P channel MOS transistors SPT1 and SPT2 are provided to supply two types of voltages, that is, (1) boosted voltage Vpp and (2) supply voltage Vcc and thereafter boosted voltage Vpp, to the gate of N channel MOS transistor NT2. The voltage supplied to the gate of transistor NT2 can be changed by the wire-bonding of pad PAD. Accordingly, the ringing can be prevented effectively and a desired pull-down characteristic can be obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device comprising:
   an internal circuit generating an internal signal in response to an external input signal; and
   an output buffer generating an external output signal in response to said internal signal, said output buffer including:
   a first N channel MOS transistor connected between a power supply node and an output node, turned on when said internal signal is in a first state and turned off when said internal signal is in a second state;
   a second N channel MOS transistor connected between said output node and a ground node, and turned on/off complementarily to said first N channel MOS transistor; and
   a control circuit supplying a ground voltage to the gate of said second N channel MOS transistor when said internal signal is in the first state, supplying a power supply voltage to the gate of said second N channel MOS transistor and thereafter supplying voltage higher than said power supply voltage when said internal signal is in the second state.

2. The semiconductor integrated circuit device according to claim 1, wherein
   said control circuit includes:
   a first drive circuit supplying the ground voltage to the gate of said second N channel MOS transistor when said internal signal is in the first state, and supplying the power supply voltage to the gate of said second N channel MOS transistor when said internal signal is in the second state;
   a delay circuit delaying said internal signal; and
   a second drive circuit supplying the ground voltage to the gate of said second N channel MOS transistor when the internal signal delayed by said delay circuit is in the first state, and supplying voltage higher than the power supply voltage to the gate of said second N channel MOS transistor when the internal signal delayed by said delay circuit is in the second state.

3. The semiconductor integrated circuit device according to claim 2, wherein
   said first drive circuit includes:
   a first P channel MOS transistor connected between the power supply node and the ground node;

a first N channel MOS transistor connected between said first P channel MOS transistor and the ground node, and turned on/off in response to said internal signal;

a second P channel MOS transistor connected between the power supply node and the ground node in parallel with said first P channel MOS transistor, and receiving at its gate voltage on an interconnection node of said first P channel MOS transistor and said first N channel MOS transistor;

a second N channel MOS transistor connected between said second P channel MOS transistor and the ground node, and turned on/off complementarily to said first N channel MOS transistor;

a third P channel MOS transistor connected between the power supply node and the ground node in parallel with said first and second P channel MOS transistors, and receiving at its gate voltage on an interconnection node of said second P channel MOS transistor and said second N channel MOS transistor; and a third N channel MOS transistor connected between said third P channel MOS transistor and the ground node, receiving at its gate voltage on the interconnection node of said second P channel MOS transistor and said second N channel MOS transistor, and said second drive circuit includes:

a fourth P channel MOS transistor connected between the ground node and a boosted node boosted to voltage higher than the power supply voltage;

a fourth N channel MOS transistor connected between said fourth P channel MOS transistor and the ground node, and turned on/off in response to an internal signal delayed by said delay circuit;

a fifth P channel MOS transistor connected between said boosted node and the ground node in parallel with said fourth P channel MOS transistor, and receiving at its gate voltage on an interconnection node of said fourth P channel MOS transistor and said fourth N channel MOS transistor;

a fifth N channel MOS transistor connected between said fifth P channel MOS transistor and the ground node, and turned on/off complementarily to said fourth N channel MOS transistor;

a sixth P channel MOS transistor connected between said boosted node and the ground node in parallel with said fourth and fifth P channel MOS transistors, receiving at its gate voltage on an interconnection node of said fifth P channel MOS transistor and said fifth N channel MOS transistor; and a sixth N channel MOS transistor connected between said sixth P channel MOS transistor and the ground node, and receiving at its gate voltage on the interconnection node of said fifth P channel MOS transistor and said fifth N channel MOS transistor.

4. The semiconductor integrated circuit device according to claim 1, further comprising;

a latch circuit latching an external input signal; and a mode set signal generating circuit generating a mode set signal that enables said latch circuit to latch, wherein said control circuit includes:

a first drive circuit which stops when an output from said latch circuit is in the first state, and operates when the output from said latch circuit is in the second state to supply the ground voltage to the gate of said second N channel MOS transistor when said internal signal is in the first state, and to supply the power supply voltage to the gate of said second N channel MOS transistor when said internal signal is in the second state;

a delay circuit which stops when the output from said latch circuit is in the first state and operates when the output from said such latch circuit is in the second state to delay said internal signal; and a second drive circuit receiving said internal signal when the output from said latch circuit is in the first state to supply the ground voltage to the gate of said second N channel MOS transistor when said internal signal is in the first state and to supply voltage higher than the power supply voltage to the gate of said second N channel MOS transistor when said internal signal is in the second state, and receiving an internal signal delayed by said delay circuit when the output from said latch circuit is in the second state to supply the ground voltage to the gate of said second N channel MOS transistor when the internal signal delayed by said delay circuit is in the first state and to supply voltage higher than the power supply voltage to the gate of said second N channel MOS transistor when the internal signal delayed by said delay circuit is in the second state.

5. The semiconductor integrated circuit device according to claim 1, further comprising a pad connected to a power supply terminal or a ground terminal, wherein said control circuit includes:

a first drive circuit which stops when voltage on said pad is one of the power supply voltage and the ground voltage and operates when the voltage on said pad is the other of the power supply voltage and the ground voltage to supply the ground voltage to the gate of said second N channel MOS transistor when said internal signal is in the first state and to supply the power supply voltage to the gate of said second N channel MOS transistor when said internal signal is in the second state;

a delay circuit which stops when the voltage on said pad is one of the power supply voltage and the ground voltage and operates when the voltage on said pad is the other of the power supply voltage and the ground voltage to delay said internal signal; and a second drive circuit receiving said internal signal when the voltage on said pad is one of the power supply voltage and the ground voltage to supply the ground voltage to the gate of said second N channel MOS transistor when said internal signal is in the first state and to supply voltage higher than the power supply voltage to the gate of said second N channel MOS transistor when said internal signal is in the second state, and receiving an internal signal delayed by said delay circuit when the voltage on said pad is the other of the power supply voltage and the ground voltage to supply the ground voltage to the gate of said second N channel MOS transistor when the internal signal delayed by said delay circuit is in the fist state and to supply voltage higher than the power supply voltage to the gate of said second N channel MOS transistor when the internal signal delayed by said delay circuit is in the second state.

* * * * *